(12) United States Patent
Kakinuma et al.

(10) Patent No.: US 6,335,675 B1
(45) Date of Patent: Jan. 1, 2002

(54) SEMICONDUCTOR MAGNETORESISTANCE DEVICE, MAKING METHOD AND MAGNETIC SENSOR

(75) Inventors: Sei Kakinuma; Masaichi Miyano; Katsuya Iwai, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/527,808

(22) Filed: Mar. 17, 2000

(30) Foreign Application Priority Data

Mar. 18, 1999 (JP) ............................... 11-074207

(51) Int. Cl.$^7$ ............................................. H01L 43/00
(52) U.S. Cl. .......................... 338/32 R; 338/32; 338/4; 324/207.21; 29/610.1
(58) Field of Search ............................. 338/32 R, 324, 338/309; 324/207.4, 207.13, 252.1, 247, 249; 29/610.1, 610.2

(56) References Cited

U.S. PATENT DOCUMENTS 4,296,424 A * 10/1981 Shibasaki et al. ............... 357/1
5,196,821 A * 3/1993 Partin et al. ............... 338/22 R
5,656,381 A * 8/1997 Maeda et al. ................ 428/611

FOREIGN PATENT DOCUMENTS

| JP | 56-60078 | | 5/1981 |
| JP | 3-214783 | * | 9/1991 |
| JP | 10-70323 | | 3/1998 |
| JP | 10-209520 | | 8/1998 |
| JP | 10-209523 | | 8/1998 |
| JP | 10-209524 | | 8/1998 |

* cited by examiner

Primary Examiner—Karl D. Easthom
Assistant Examiner—Kyung S. Lee
(74) Attorney, Agent, or Firm—Oblon, Spivak, McClelland, Maier & Neustadt, P.C.

(57) ABSTRACT

A semiconductor magnetoresistance device having plural pairs of opposed short-circuiting electrodes (13) on the opposed surfaces of a semiconductor magneto-sensitive layer (12) shows a great resistance change relative to a magnetic flux density.

11 Claims, 4 Drawing Sheets

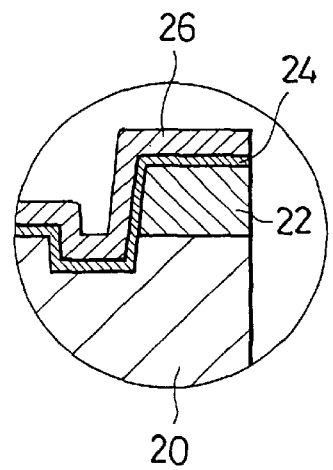

—■— DOUBLE SIZE SHORT-CIRCUITING ELECTRODES (EXAMPLE)

—△— BURIED ACICULAR CRYSTALS (COMPARATIVE EXAMPLE 2)

—◆— ONE SIDE SHORT-CIRCUITING ELETRODES (COMPARATIVE EXAMPLE 1)

SEMICONDUCTOR MAGNETORESISTANCE DEVICE, MAKING METHOD AND MAGNETIC SENSOR

This invention relates to a semiconductor magnetoresistance device capable of sensing a change of magnetic flux density and useful for detecting rotation, displacement or the presence of magnetic material.

BACKGROUND OF THE INVENTION

Semiconductor magnetoresistance (MR) devices include magneto-sensitive layers which are preferably made of semiconductors having a high electron mobility such as indium antimonide (InSb) and indium arsenide (InAs). Indium antimonide is most often used because of the highest electron mobility. The InSb magneto-sensitive layers are generally prepared by either a thin film technique such as evaporation or sputtering or a bulk technique such as slicing of a single crystal ingot or polishing of a single crystal piece.

For semiconductor MR devices, a few structures are employed to increase a resistance change represented by $R_B/R_0$ wherein $R_B$ is a resistance value under an applied magnetic field and $R_0$ is a resistance value in the absence of a magnetic field. A first structure having short-circuiting electrodes formed on a magneto-sensitive layer is disclosed in JP-A 10-70323, JP-A 10-209520, JP-A 10-209523, and JP-A 10-209524. A second structure having high conductivity acicular crystals buried within InSb is disclosed in JP-A 56-60078. In the first structure, as shown in FIG. 4, a semiconductor MR film 102 is formed on a surface of a substrate 101. Short-circuiting electrodes 103 and electrical signal output electrode pads 104 are formed on the semiconductor MR film 102.

Means for altering the resistance value in the absence of a magnetic field of a MR device is generally divided into two: a method of changing the geometrical pattern of the magneto-sensitive layer and a method of changing the thickness of the magneto-sensitive layer.

The method of changing the pattern design has the problems of increased time and cost partly because a brand new photomask must be furnished for the step of patterning the magneto-sensitive layer by photoetching.

In contrast, the method of changing the thickness of the magneto-sensitive layer is simple and inexpensive because the thickness can be adjusted by controlling the deposition time involved in the thin film technique or by controlling the polishing time involved in the bulk technique.

However, the thickness changing method is not compatible with the first structure. If the magneto-sensitive layer is made thick in order to reduce the resistance in the absence of a magnetic field, the short-circuiting electrodes fail to exert their effect in the depth of the magneto-sensitive layer, resulting in a drop of $R_B/R_0$.

As to the second structure, increasing the thickness of the magneto-sensitive layer invites little drop of $R_B/R_0$. However, if an InSb magneto-sensitive layer with acicular crystals buried therein is crystallized, crystal defects develop, failing to produce an InSb magneto-sensitive layer having a high mobility. No satisfactory $R_B/R_0$ is available.

SUMMARY OF THE INVENTION

An object of the invention is to provide a semiconductor magnetoresistance device which permits a magneto-sensitive layer to be increased in thickness while preserving a high $R_B/R_0$ and thus permits the use of the simple, inexpensive method of controlling the thickness of the magneto-sensitive layer for changing the resistance value in the absence of a magnetic field.

Another object is to provide a method for preparing the semiconductor magnetoresistance device. A further object is to provide a magnetic sensor.

In a first aspect, the invention provides a semiconductor magnetoresistance device comprising a semiconductor magneto-sensitive layer having a pair of opposed surfaces and plural pairs of opposed short-circuiting electrodes formed on the opposed surfaces of the layer.

Preferably, the semiconductor magneto-sensitive layer is formed of indium antimonide or indium arsenide and is a single crystal. In one preferred embodiment, each of the opposed surfaces of the semiconductor magneto-sensitive layer is provided with recesses where the short-circuiting electrodes are formed. Typically the semiconductor magneto-sensitive layer has a thickness of 10 to 50 μm.

The device may further include a substrate on which the semiconductor magneto-sensitive layer is disposed and a protective film disposed between the semiconductor magneto-sensitive layer and the substrate. The substrate is preferably comprised of ferrite and especially Ni—Zn base ferrite.

In a second aspect, the invention provides a method for preparing a semiconductor magnetoresistance device as defined above. A photosensitive resin is applied onto one surface of a semiconductor magneto-sensitive layer, and the photosensitive resin is patterned into a negative pattern of short-circuiting electrodes. A metal thin film is formed on the layer surface, and the layer is dipped in a solution in which the photosensitive resin is readily dissolved, thereby removing the portions of the metal thin film that are located on the patterned photosensitive resin, the remaining portions of the metal thin film forming short-circuiting electrodes. A protective film is formed on the short-circuiting electrode-bearing surface of the layer, and the layer at the protective film side is bonded to a substrate. Thereafter, short-circuiting electrodes are similarly formed on the other surface of the semiconductor magneto-sensitive layer. The method may further involve, between the patterning step and the metal thin film forming step, the step of etching the layer through openings in the negative pattern to form recesses in the layer where the short-circuiting electrodes are to be formed.

Also contemplated herein is a magnetic sensor comprising the semiconductor magnetoresistance device defined herein.

When the magneto-sensitive layer is relatively thin, the mere provision of short-circuiting electrodes on both the surfaces of the magneto-sensitive layer increases the likelihood of short-circuiting. Even when the magneto-sensitive layer is relatively thick, the provision of short-circuiting electrodes embedded in both the surfaces of the magneto-sensitive layer enables the short-circuiting electrodes to exert their effect to the deep section or intermediate section of the magneto-sensitive layer. In either case, a high $R_B/R_0$ is maintained.

DESCRIPTION OF THE PREFERRED EMBODIMENT

Figure 1:
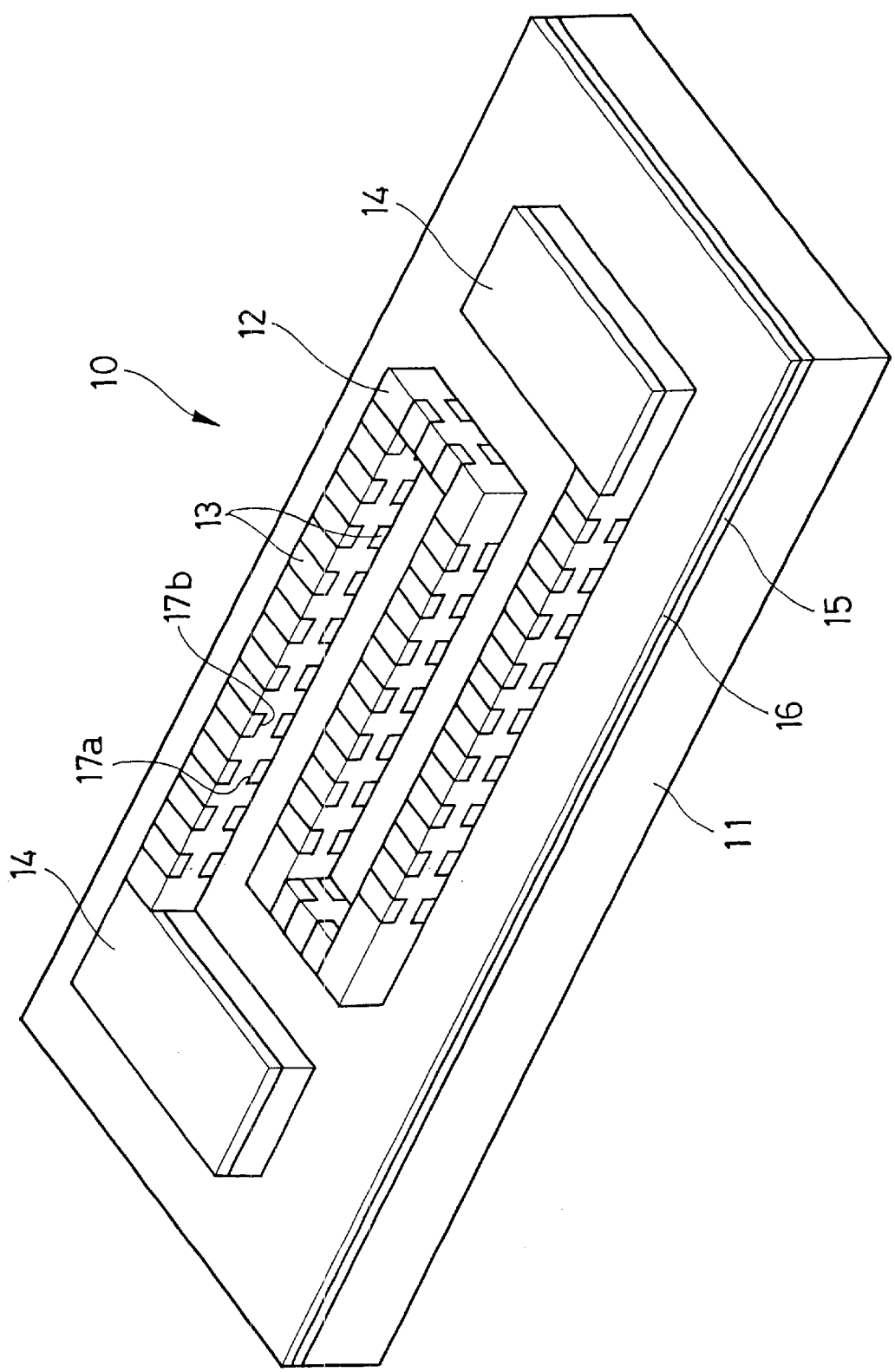
FIG. 1 is a perspective view of a semiconductor MR device having short-circuiting electrodes formed on the front and rear surfaces of a magneto-sensitive layer according to one embodiment of the invention.

Referring to FIG. 1, there is illustrated in a perspective view a semiconductor thin-film magnetoresistance (MR) device according to one embodiment of the invention. The semiconductor MR device designated at 10 includes a substrate 11, a semiconductor magneto-sensitive layer 12 on the surface of the substrate 11, plural pairs of short-circuiting electrodes 13 formed on the front and rear surfaces (upper and lower surfaces) of the magneto-sensitive layer 12, and electrical signal output electrode pads 14. In one preferred embodiment, an insulating protective film 15 is disposed below the side of the short-circuiting electrodes 13 facing the substrate 11. The protective film 15 is bonded to the substrate 11 through an adhesive layer 16.

The substrate 11, on which the semiconductor magneto-sensitive layer is formed or fixedly rested, serves to focus a magnetic field at the semiconductor magneto-sensitive layer and is preferably made of a magnetic material. Preferred magnetic materials include permalloy, silicon steel, Mn—Zn base ferrite, and Ni—Zn base ferrite. Of these, Ni—Zn base ferrite which is electrically insulating by itself is most preferred. The ferrite substrate preferably has a thickness of 0.2 to 2 mm, and especially 0.3 to 1 mm.

The semiconductor magneto-sensitive layer 12 should preferably have a high electron mobility, though not critical, and specifically of at least 2 $m^2$/V-s and especially about 4 to 7.8 $m^2$/V-s. Preferred materials are indium antimonide (InSb) and indium arsenide (InAs). Indium antimonide (InSb) is most preferred since it has a high electron mobility.

Also preferably the semiconductor magneto-sensitive layer has a thickness of 0.1 to 100 $\mu$m, and especially 1 to 50 $\mu$m. Better results are obtained when the thickness is greater than about 10 $\mu$m. As the thickness increases, the semiconductor magneto-sensitive layer has a reduced electrical resistance as a whole though its $R_B/R_0$ remains unchanged. When a constant voltage is applied across such a device, a greater current flows as compared with devices having a thin semiconductor magneto-sensitive layer. Then the device becomes less affected by noise and unlikely to malfunction. The greater the width W of the semiconductor magneto-sensitive layer and the shorter the distance L between short-circuiting electrodes, better become the results. The length/width (L/W) ratio is preferable up to $1/10$, and more preferably up to $1/20$. It is noted that in conjunction with the semiconductor magneto-sensitive layer 12, the thickness is the distance between the upper and lower surfaces thereof as viewed in FIG. 1, and the width W is a transverse distance.

The short-circuiting electrodes 13 are preferably constructed of a low resistivity metal or metals such as Cu, Au, Al, Ni, Cr, and Ti, with the copper, gold and aluminum being especially preferred. Each electrode may consist of a plurality of stacked layers of different types. The electrodes preferably have a thickness of 0.1 to 10 $\mu$m, and especially 0.4 to 1 $\mu$m although the exact thickness varies with the desired $R_B/R_0$. Within this thickness range, $R_B/R_0$ values of about 15 to 30 (as measured at 1 T) are achievable.

For improving the adhesion and preventing interdiffusion between the semiconductor magneto-sensitive layer 12 and the short-circuiting electrodes 13, it is effective to form an intermediate layer therebetween. The intermediate layer is formed of such a metal as chromium, titanium, tungsten or nickel or a mixture thereof. The term "short-circuiting electrode" is used as including such an intermediate layer. The intermediate layer has a thickness of about 0.01 to 0.2 $\mu$m when it is made of Cr, Ti or W, and about 0.1 to 0.3 $\mu$m when Ni is used.

When the semiconductor magneto-sensitive layer is thick, especially more than 10 $\mu$m thick, each pair of short-circuiting electrodes 13 are preferably embedded in a pair of recesses 17a and 17b in the opposed surface of the semiconductor magneto-sensitive layer 12 as shown in FIG. 1. By the term "embedment" used herein, it is meant that the surface of short-circuiting electrode is coplanar with or slightly above or below the surface of the semiconductor magneto-sensitive layer.

The recesses 17a, 17b in the semiconductor magneto-sensitive layer 12 are preferably of the same depth on the opposed surfaces although they may be of different depth. The depth of the recesses 17a, 17b may be identical to or different from the thickness of the short-circuiting electrodes 13. When different, it is preferred that the depth of the recesses 17a, 17b be greater than the thickness of the short-circuiting electrodes 13 because this enables to facilitate the formation of short-circuiting electrodes, reduce the distance between short-circuiting electrodes, and increase the $R_B/R_0$ value.

The material and construction of the output electrode pads 14 are preferably the same as those of the short-circuiting electrodes because the manufacturing process can be simplified.

The protective film 15 is preferably formed of an insulating material such as $Al_2O_3$, $SiO_2$, $TiO_2$, MgO, $ZrO_2$ or $Fe_2O_3$. Of these, $Al_2O_3$ is most preferred since it is chemically stable and easy to deposit. The protective film preferably has a thickness of about 0.5 to 10 $\mu$m, and especially about 0.5 to 2 $\mu$m.

For the adhesive layer 16, poly-imide adhesives, thermosetting epoxy adhesives and other adhesives may be used, with the thermosetting epoxy adhesives being preferred.

Referring to FIG. 2, the method for preparing a semiconductor MR device according to the invention is described. The method described herein relies on the bulk technique.

The method starts with a material of which a magneto-sensitive strip (or semiconductor magneto-sensitive layer) is constructed, for example, an InSb single crystal ingot. The ingot is sliced to the desired thickness by means of a wire saw, obtaining a wafer 20 as shown in FIG. 2. One surface of the wafer 20 is subjected to flattening/abrasive treatment as by polishing, achieving a flat surface or mirror finish.

After cleaning, a photoresist or photosensitive resin (e.g., OFPR800-100cp by Tokyo Oka K.K.) is applied onto the mirror finished surface of the wafer 20 to a thickness of 2 $\mu$m or greater and pre-baked to form a photoresist film 22 as shown in FIG. 2(*a*). The photoresist film 22 is exposed by means of an aligner and developed to form a negative pattern of short-circuiting electrodes as shown in FIG. 2(*b*).

Then, the wafer is dipped in a solution in which the semiconductor magneto-sensitive layer is readily dissolved, for example, a hydrofluoric acid solution for etching the wafer through openings in the photoresist to a desired depth to form recesses 17a as shown in FIG. 2(*c*). By sputtering, a nickel film 24 of 0.1 to 0.3 $\mu$m thick and a copper film 26 of 0.3 to 0.7 $\mu$m thick were successively formed over the entire surface of the wafer as shown in FIG. 2(*d*). The nickel film helps improve the bond between the copper film and the InSb wafer. Instead of nickel, use may be made of chromium, tungsten or titanium or a mixture of any two or more of nickel, chromium, tungsten and titanium. Understandably, these metal films may be formed by evaporation, CVD or plating instead of sputtering.

Figure 2A:
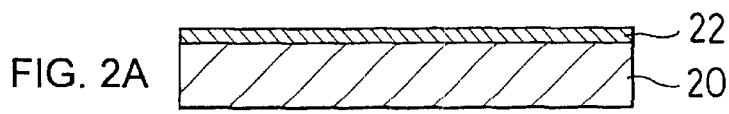
FIG. 2 illustrates one exemplary method for preparing a semiconductor MR device according to the invention.
Figure 2B:
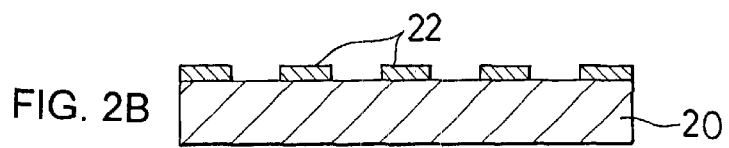
Figure 2C:
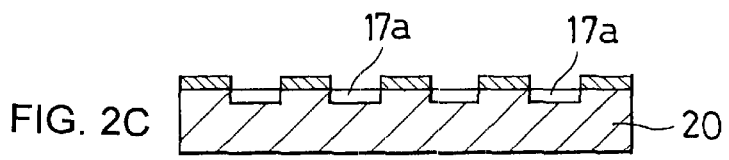
Figure 2D:
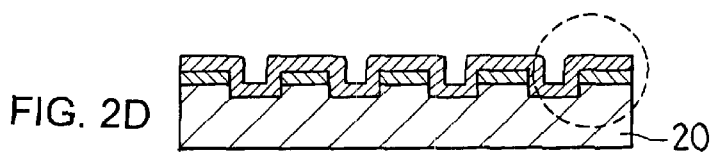
Figure 2E:
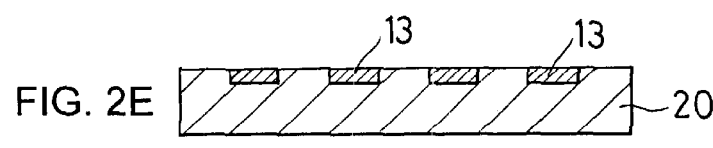

Next, the wafer is dipped in acetone for removing the photoresist film 22. Together with the photoresist film 22, those portions of the nickel and copper films 24 and 26 lying thereon are removed, resulting in a structure in which the remaining portions of the metal films (24, 26) embedded in the recesses 17a become short-circuiting electrodes 13, as shown in FIG. 2(e). Thereafter, a protective film 15 is formed on the electrode-embedded surface of the wafer 20 by sputtering $Al_2O_3$, for example. A substrate 11 which has been separately prepared is adhesively bonded to the electrode-embedded surface of the wafer 20 using an adhesive layer 16. This results in a structure as shown in FIG. 2(f).

Figure 2F:
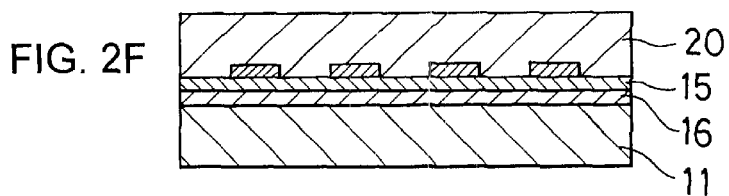

The other surface (upper surface in FIG. 2(f)) of the wafer 20 is lapped and then subjected to flattening/abrasive treatment as by polishing, achieving a flat surface or mirror finish. At this point, the thickness of the wafer 20 between the previously polished one surface and the subsequently polished opposite surface is the desired thickness of the magneto-sensitive strip. From now on, the steps corresponding to FIGS. 2(b) to 2(e) are repeated. Notably, the previously processed one surface of the wafer is referred to as the rear surface, hereinafter.

Figure 2G:
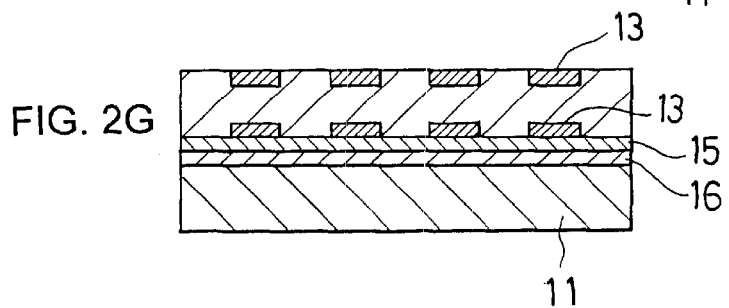

Specifically, after cleaning, a photoresist is coated and pre-baked, then exposed by means of an aligner, and developed, obtaining a negative pattern of short-circuiting electrodes (preferably including electrical signal output electrode pads at this time). The pattern direction is the same as that on the rear surface. The wafer is dipped in hydrofluoric acid with which the front surface is etched to a depth of 1 $\mu$m. Then by sputtering, a nickel film of 0.1 to 0.3 $\mu$m thick and a copper film of 0.3 to 0.7 $\mu$m thick are deposited over the entire surface. The wafer is dipped in acetone to remove the photoresist and the overlying portions of the nickel and copper films. This gives a structure as shown in FIG. 2(g).

Thereafter, though not shown, a dry film of photosensitive resin for sand blasting is attached to the surface of the structure. The film is exposed through a patterned mask by means of an aligner, and developed to form a pattern for the magneto-sensitive layer (this pattern is meander shape as seen from FIG. 1). By sand blasting, the InSb wafer is abraded away where it is not protected by the patterned dry film, resulting in the pattern of magneto-sensitive layer.

After the dry film is peeled off, the structure is cleaned and cut by means of a dicing saw. There are obtained discrete dice. In this way, the semiconductor MR device of the invention is fabricated.

As compared with prior art devices, the semiconductor MR device of the invention is very sensitive to a change of magnetic flux density and finds use as a device for magnetic detection. More illustratively, the device of the invention can be used as rotation or displacement detecting sensors in vehicles having an internal combustion engine or drive shaft such as automobiles, motor cycles and trains, rotation detecting sensors in drives for optical and magnetic recording media such as compact discs (CD) and digital versatile discs (DVD), rotation detecting sensors in tape recorders and video recorders, magnetic card readers, and magnetic ink detecting sensors.

By virtue of its very high sensitivity, the semiconductor MR device of the invention is recommended for use as a magnetic ink detecting sensor adapted to detect a minute change of magnetic flux density. Under the current circumstance where magnetic ink is partially used in the printing of bills for the purpose of preventing paper money forgery, the semiconductor MR device of the invention is quite useful as a device for judging whether bills are genuine or not.

When the semiconductor MR device of the invention is used as a sensor, it is usually combined with a permanent magnet or electromagnet for applying a biasing magnetic field. The size of the magnet and the magnetic flux density produced thereby may be properly adjusted in accordance with the sensor specifications. Specifically, a magnetic flux density B of about 100 to 500 mT, and especially about 200 to 300 mT is preferred. Typical magnets producing such a magnetic field are Nd—Fe—B and Sm—Co magnets.

EXAMPLE

Examples of the invention are given below by way of illustration and not by way of limitation.

Semiconductor MR device samples were fabricated in accordance with the process shown in FIG. 2. The bulk technique was employed herein.

An InSb single crystal ingot as the material of which a magneto-sensitive strip was to be constructed was sliced to a thickness of 0.25 mm by means of a wire saw, obtaining a wafer. One surface of the wafer was polished to a mirror finish. This InSb single crystal wafer had an electron mobility of 68,000 $m^2$/V-s.

After cleaning, a photoresist (OFPR800-100cp photosensitive resin by Tokyo Oka K.K.) was applied onto the wafer surface and pre-baked to form a photoresist film, which was exposed by means of an aligner and developed to form a negative pattern of short-circuiting electrodes.

Then, the wafer was dipped in a hydrofluoric acid solution for etching the wafer to a depth of 1 $\mu$m. By sputtering, a nickel film of 0.2 $\mu$m thick and a copper film of 0.45 $\mu$m thick were successively formed over the entire surface of the wafer.

Next, the wafer was dipped in acetone for removing the photoresist and the overlying portions of the nickel and copper films. Thereafter, a protective film of $Al_2O_3$ was formed on the wafer by sputtering. A ferrite substrate was adhesively bonded to the electrode-bearing surface of the wafer using a thermosetting epoxy adhesive.

The other surface of the wafer was lapped to a thickness of about 50 $\mu$m and then polished to a mirror finish. At this point, the InSb wafer was 20 $\mu$m thick.

After cleaning, a photoresist was coated and pre-baked, then exposed by means of an aligner, and developed, obtaining a negative pattern of short-circuiting electrodes and electrical signal output electrode pads. The pattern direction was the same as that on the rear surface.

The wafer was dipped in hydrofluoric acid for etching to a depth of 1 $\mu$m. Then by sputtering, a nickel film of 0.2 $\mu$m thick and a copper film of 0.45 $\mu$m thick were deposited over the entire surface. The electrodes were thus 0.65 $\mu$m thick.

The wafer was dipped in acetone to remove the photoresist and the overlying portions of the nickel and copper films.

Thereafter, a dry film for sand blasting (BF405 photosensitive resin by Tokyo Oka K.K.) was attached to the surface of the structure. The film was exposed by means of an aligner, and developed to form a pattern for the magneto-sensitive layer.

By sand blasting, the InSb wafer was abraded away where it was not protected by the patterned dry film, resulting in the pattern of InSb magneto-sensitive layer.

After the dry film was peeled off, the structure was cleaned and cut by means of a dicing saw. There are obtained discrete dice which were the semiconductor MR devices of the invention.

A voltage of 5 volts was applied between the output electrode pads on the sample in the absence of a magnetic field, and a resistance $R_0$ was calculated from a reading of current. While a magnetic field increasing to 1.2 T was successively applied, a reading of current were obtained. A resistance $R_B$ was calculated from the voltage and each current reading.

Figure 3:
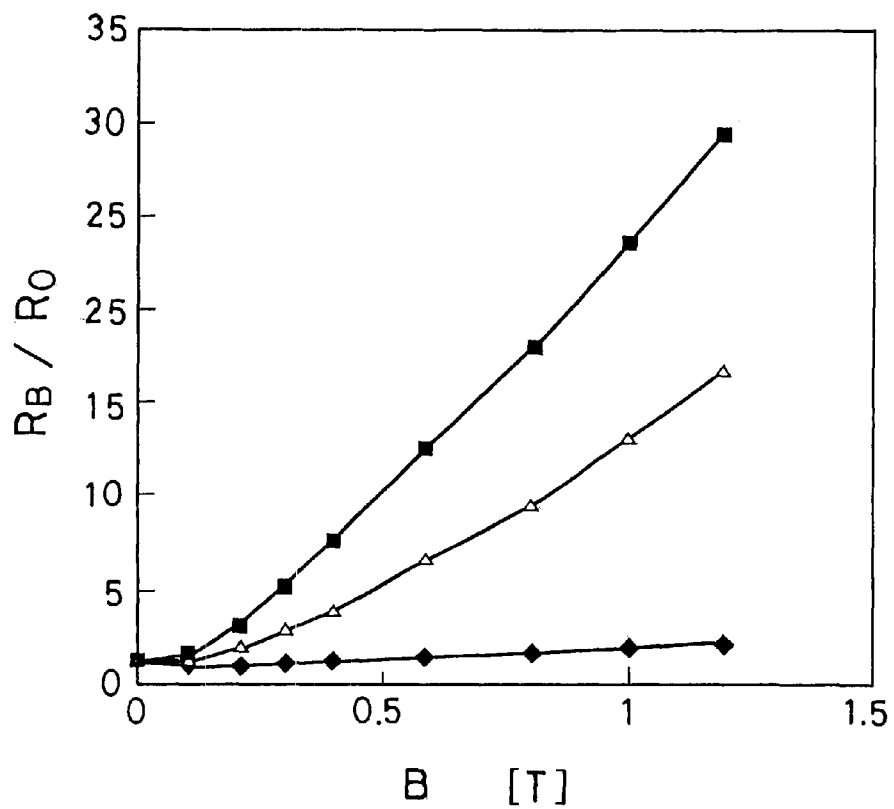
FIG. 3 is a graph showing the sensitivity ( ) curve of a semiconductor MR device.

In the graph of FIG. 3, the $R_B/R_0$ value is plotted relative to the magnetic flux density.

Figure 4:
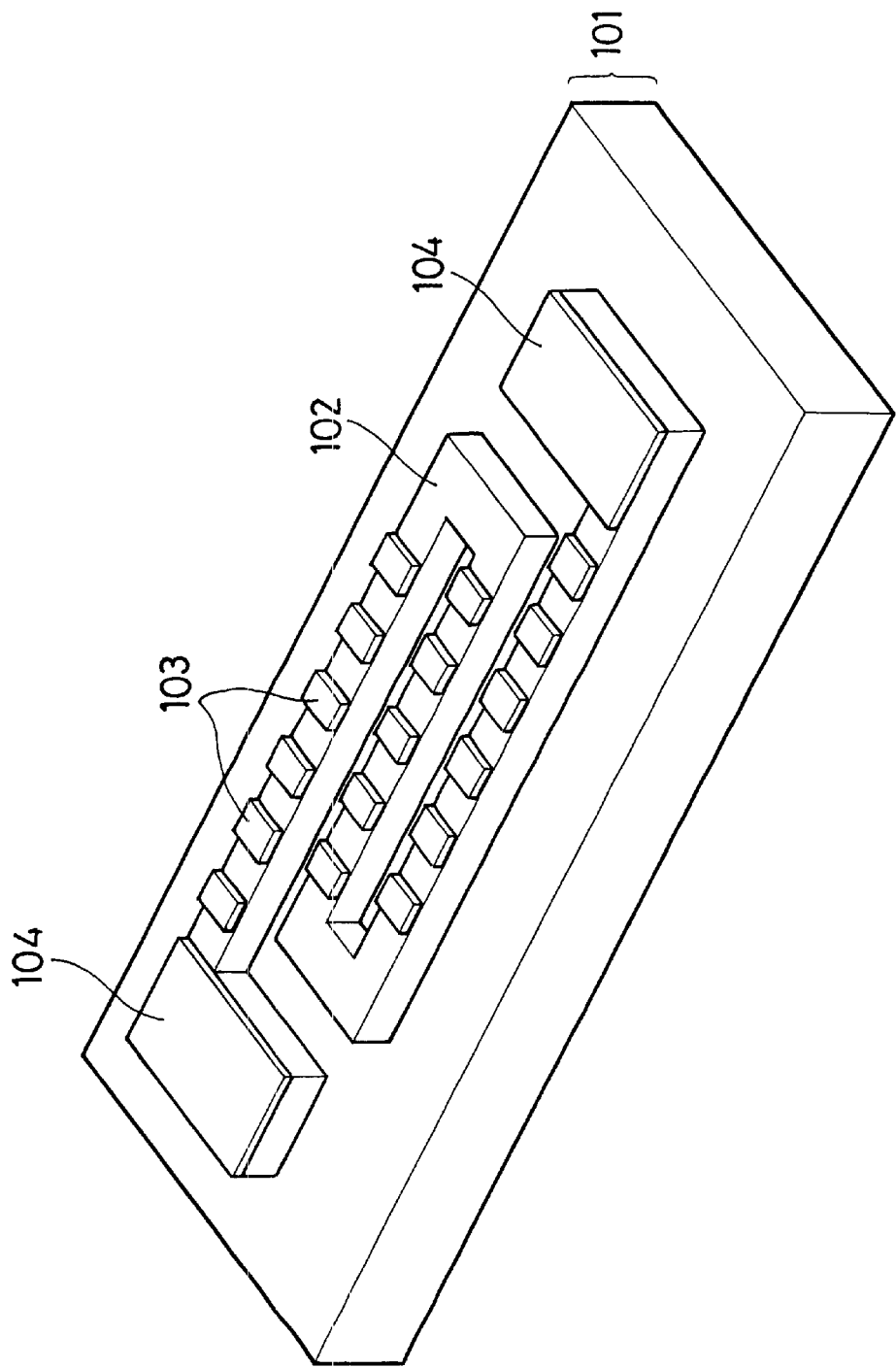
FIG. 4 is a perspective view of a prior art semiconductor MR device having short-circuiting electrodes formed on one surface of a magneto-sensitive layer.

For comparison purposes, there were fabricated a sample having a magneto-sensitive layer of 20 μm thick as in Example, but the one-side short-circuiting electrode structure as shown in FIG. 4 (Comparative Example 1), and a sample having the acicular crystal-buried MR device structure (Comparative Example 2). Measurement was similarly made on these samples, with the results also plotted in the graph of FIG. 3.

It is evident from the curves in FIG. 3 that the sample of Comparative Example 1 shows little change of $R_B/R_0$ because the magneto-sensitive layer has a relatively large thickness of 20 μm. The sample of Comparative Example 2 shows a larger change of $R_B/R_0$ than Comparative Example 1, but the change is still insufficient because of failure to produce high mobility InSb. The MR device having short-circuiting electrodes on both front and rear surfaces of a magneto-sensitive layer shows a significantly large change of $R_B/R_0$ despite the large thickness of the magneto-sensitive layer.

Since the simple, inexpensive method of controlling the thickness of a magneto-sensitive layer can be employed for changing the resistance value in the absence of a magnetic field, the semiconductor MR device of the invention permits a magneto-sensitive layer to be increased in thickness while preserving a high $R_B/R_0$. Such an improved device can be prepared by the method of the invention. A magnetic sensor comprising the device has a high sensitivity.

Japanese Patent Application No. 11-74207 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A semiconductor magnetoresistance device comprising:
   a semiconductor magneto-sensitive layer having a pair of opposed surfaces; and
   plural pairs of opposed short-circuiting electrodes with each one member of said pairs formed on the opposed surfaces of the magneto-sensitive layer.

2. The semiconductor magnetoresistance device of claim 1, wherein said semiconductor magneto-sensitive layer is formed of indium antimonide or indium arsenide.

3. The semiconductor magnetoresistance device of claim 1, wherein said semiconductor magneto-sensitive layer is a single crystal.

4. The semiconductor magnetoresistance device of claim 1, wherein each of the opposed surfaces of said semiconductor magneto-sensitive layer is provided with recesses where the short-circuiting electrodes are formed.

5. The semiconductor magnetoresistance device of claim 1, wherein said semiconductor magneto-sensitive layer has a thickness of 10 to 50 μm.

6. The semiconductor magnetoresistance device of claim 1, further comprising:
   a substrate on which said semiconductor magneto-sensitive layer is disposed; and
   a protective film disposed between said semiconductor magneto-sensitive layer and the substrate.

7. The semiconductor magnetoresistance device of claim 6, wherein said substrate is comprised of ferrite.

8. The semiconductor magnetoresistance device of claim 7, wherein said substrate is comprised of Ni—Zn base ferrite.

9. A magnetic sensor comprising:
   the semiconductor magnetoresistance device of any one of claims 1 to 8.

10. A method for preparing a semiconductor magnetoresistance device with a semiconductor magneto-sensitive layer having a pair of opposed surfaces and plural pairs of opposed short-circuiting electrodes with each one member of said pairs formed on the opposed surfaces of the magneto-sensitive layer, said method comprising the steps of:
    applying a photosensitive resin onto one surface of the semiconductor magneto-sensitive layer;
    patterning the photosensitive resin into a negative pattern of short-circuiting electrodes;
    forming a metal thin film on said one surface;
    dipping the layer in a solution in which the photosensitive resin is readily dissolved, thereby removing the portions of the metal thin film that are located on the patterned photosensitive resin, wherein remaining portions of the metal thin film form a set of said short-circuiting electrodes;
    forming a protective film on a short-circuiting electrode-bearing surface of said magneto-sensitive layer; and
    bonding said magneto-sensitive layer at a protective film side to a substrate, and similarly forming another set of said short-circuiting electrodes on an opposed surface of said semiconductor magneto-sensitive layer.

11. The method of claim 10, further comprising:
    between the patterning step and the metal thin film forming step, etching said layer through openings in the negative pattern to form recesses in said magneto-sensitive layer where the short-circuiting electrodes are to be formed.

* * * * *